United States Patent [19]
Pierret

[11] Patent Number: 6,031,360
[45] Date of Patent: Feb. 29, 2000

[54] REGULATOR FOR A POLYPHASE ALTERNATOR FOR A MOTOR VEHICLE

[75] Inventor: Jean-Marie Pierret, Paris, France

[73] Assignee: Valeo Equipements Electriques Moteur, Creteil, France

[21] Appl. No.: 09/220,661

[22] Filed: Dec. 24, 1998

[30] Foreign Application Priority Data

Dec. 24, 1997 [FR] France .................................. 97 16495

[51] Int. Cl.[7] .............................. H02H 7/06; H02K 11/00
[52] U.S. Cl. ................................................ 322/99; 322/20
[58] Field of Search .................................. 322/99, 20, 29; 324/416

[56] References Cited

U.S. PATENT DOCUMENTS

| | | | |
|---|---|---|---|
| 4,369,407 | 1/1983 | Korbell ................................... | 324/416 |
| 5,285,146 | 2/1994 | Pierret et al. ............................. | 322/25 |
| 5,357,186 | 10/1994 | Pennisi et al. .......................... | 320/128 |
| 5,471,135 | 11/1995 | Jagger et al. ......................... | 324/158.1 |
| 5,521,486 | 5/1996 | Takamoto et al. ....................... | 322/99 |
| 5,701,089 | 12/1997 | Perkins ..................................... | 322/99 |

FOREIGN PATENT DOCUMENTS 2 678 070  12/1992  France .

OTHER PUBLICATIONS

French Search Report dated Sep. 1, 1998.

*Primary Examiner*—Nestor Ramirez
*Assistant Examiner*—Peter Medley
*Attorney, Agent, or Firm*—Morgan & Finnegan, L.L.P.

[57] ABSTRACT

A regulator for a polyphase alternator for a motor vehicle, the regulator including detector means for detecting a voltage difference between the phase terminals that are to receive the phase voltages from said alternator, and means for detecting a trigger signal for triggering operation in an accelerated mode, wherein the means for detecting a trigger signal comprise means for detecting a particular level of the voltage or current on at least one of the phase terminals, and means for triggering accelerated mode operation when said voltage or current level is detected, and wherein the detector means for detecting a voltage difference between the phase terminals are suitable for detecting said voltage difference at the said current or voltage level on said phase terminal.

11 Claims, 4 Drawing Sheets

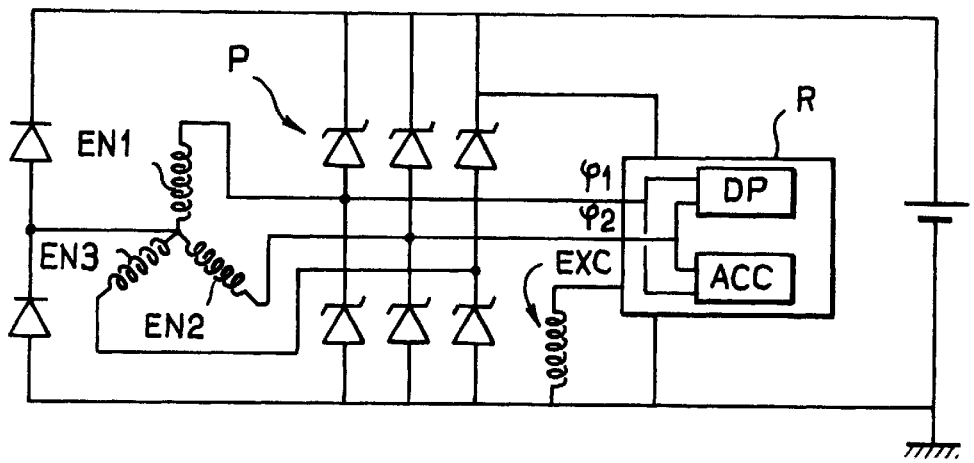
FIG_1
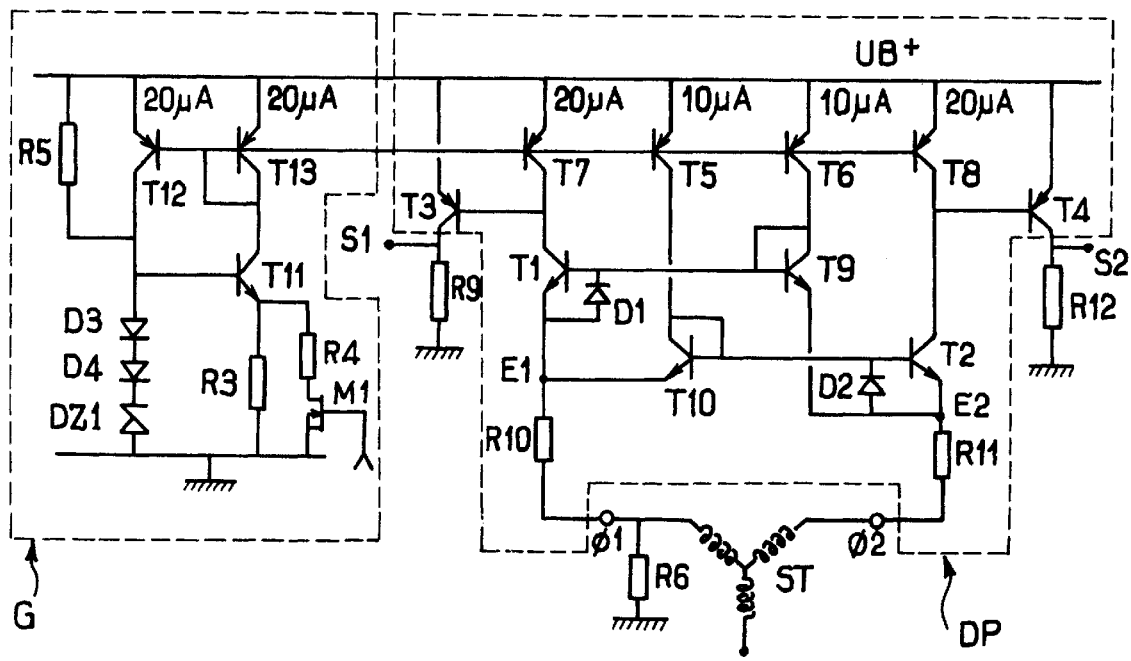
FIG_2

REGULATOR FOR A POLYPHASE ALTERNATOR FOR A MOTOR VEHICLE

The present invention relates to regulators for motor vehicle alternators.

BACKGROUND OF THE INVENTION

Recent battery voltage regulators include functions that take place over several seconds (timing on starting, progressive charging, for example). Such lengths of time are unacceptable when the regulator is being tested during and after manufacture. It is therefore necessary to accelerate the rate at which such functions take place during testing.

A conventional solution is to give rise to operation in an "accelerated" mode by using at least one additional input to the regulator.

Nevertheless, that solution suffers from the drawback of giving rise to greater mechanical complexity and greater cost, since it needs at least one additional pin.

OBJECTS AND SUMMARY OF THE INVENTION

An object of the invention is thus to provide a regulator where it is possible to trigger operation of the regulator in accelerated mode so as to reduce the time required for testing, without said regulator including any input specially dedicated to this particular function, and without the other functions of the regulator (e.g. low level self-starting) being affected.

To this end, the invention provides a regulator for a polyphase alternator for a motor vehicle, the regulator including detector means for detecting a voltage difference between the phase terminals that are to receive the phase voltages from said alternator, and means for detecting a trigger signal for triggering operation in an accelerated mode, wherein the means for detecting a trigger signal comprise means for detecting a particular level of the voltage or current on at least one of the phase terminals, and means for triggering accelerated mode operation when said voltage or current level is detected, and wherein the detector means for detecting a voltage difference between the phase terminals are suitable for detecting said voltage difference at the said current or voltage level on said phase terminal.

Advantageously, this regulator also has the various following characteristics, taken singly or in any technically feasible combination:

the means for detecting the trigger signal comprise means for detecting a particular voltage level in the peaks, at least of the voltage received on a phase terminal;

said means for detecting the trigger signal include means for detecting that the peaks of the negative half-cycles of said voltage are below a voltage threshold below ground potential;

said voltage threshold is about 10 volts below ground potential; and said means for detecting the trigger signal comprise means for detecting that the peaks of the positive half-cycles of a voltage received on a phase terminal are greater than a threshold above battery voltage.

In particularly advantageous manner, the means for detecting a voltage difference between the phase terminals comprise a transistor circuit forming a current mirror whose two branches are fed by transistor circuits forming current sources of different currents, one of the transistors of these current source circuits being limited to a predetermined current value when a voltage difference appears between the two phase terminals, said limitation causing a voltage output to change level.

In particular, in a preferred embodiment, the regulator has two logic outputs and said transistor circuits forming a current mirror and current sources are duplicated to cause one or the other of said logic outputs to change level depending on the sign of the voltage difference between the phase terminals.

Such detector means make it possible to detect a voltage difference between the phase terminals independently of the voltages of said terminals, which is not possible with the detector means described in patents FR-2 343 255, and FR-2 730 359.

They also provide detection accuracy (detection threshold level of about 200 mV) that is much better than that made possible by the circuit described in the French patent published under the number 2 678 070.

Also, the detection they provide presents little temperature drift.

In a preferred embodiment, the regulator includes means for modifying the detection threshold level for the voltage difference between the phase terminals when the voltage received on said terminals is greater than a given value.

Also advantageously, the means for triggering accelerated mode operation include a time delay circuit connected to the output of means for detecting the voltage or a current level.

BRIEF DESCRIPTION OF THE DRAWINGS

Other characteristics and advantages of the invention appear further from the description. The description is purely illustrative and non-limiting and should be read with reference to the accompanying drawings, in which:

FIG. 1 is a diagram of a conventional three-phase alternator circuit;

FIG. 2 is a diagram of a possible circuit for means for detecting the voltage difference between the phase terminals of a regulator, in accordance with a possible embodiment of the invention;

MORE DETAILED DESCRIPTION

Figure 3:
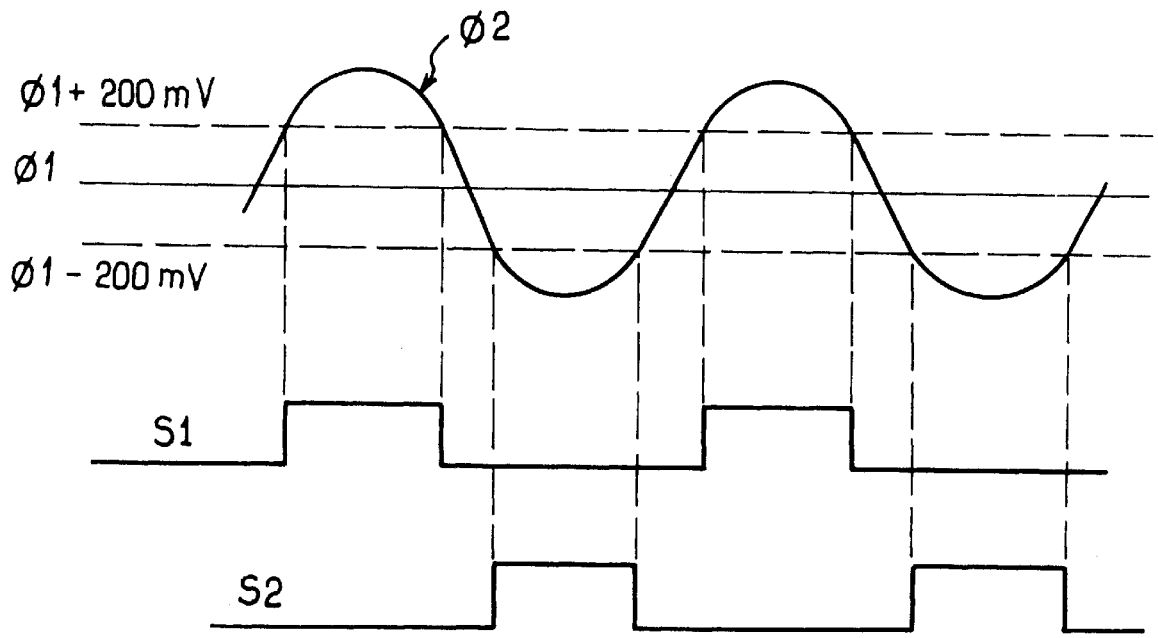
FIG. 3 shows an example of input and output signals in the FIG. 2 circuit when the alternator starts rotating.

Accompanying FIG. 1 is a diagram of a conventional three-phase alternator circuit. The circuit comprises, in particular, three star-connected alternator secondary windings EN1, EN2, and EN3, a rectifier bridge P made up of three pairs of diodes, and a regulator R having two phase inputs φ1 and φ2 receiving two of the three phase voltages from the secondary windings EN1, EN2, and EN3.

The regulator R has a circuit DP for detecting the appearance of a voltage difference between the two phase terminals φ1 and φ2 when the alternator is caused to rotate and to trigger regulation of the battery voltage when said rotation has been detected in this way.

It also has a circuit ACC which responds to at least one of the terminals of the regulator to detect a signal level corresponding to that for triggering operation of the regulator in accelerated mode.

To test the regulator, particularly after it has been manufactured and before it has been assembled on the alternator, signals are applied to the phase terminals φ1 and φ2 to simulate phase signals that might be generated by the secondary windings.

To implement such a test, accelerated operating mode of the regulator is triggered by the circuit ACC responding to one of the regulator terminals by detecting a particular signal level, different from the signal level in normal operation.

In a particularly advantageous embodiment, the accelerated operating mode can be enabled by detecting the presence of highly negative voltage peaks (of the order of 10 volts below ground potential, for example) on one or other of the phase terminals φ1 and φ2 of the regulator R. Such negative voltage peak levels do not exist in normal operation, when the regulator is fixed on an alternator, since the amplitude of the phase signals is limited by the diodes of the rectifier bridge.

The detector circuit DP is selected to enable the appearance of a voltage appearing between the phase terminals φ1 and φ2 to be detected independently of the voltage level on either of the two phases.

An example of a detector circuit DP capable of operating with highly negative peak values (−10 volts relative to ground potential) is shown in FIG. 2.

This circuit comprises two current mirrors connected between the terminals φ1 and φ2, one constituted by two NPN transistors T1, T9, and the other by two NPN transistors T2, T10.

More particularly, the terminal φ1 is connected via a resistor R10 to the emitter (point E1) of transistor T1 and to the emitter of transistor T10. The terminal φ2 is connected via a resistor R11 to the emitter of transistor T2 and also to the emitter of transistor T9. The bases of the transistors T2 and T10 are interconnected. The same is true of the bases of transistors T1 and T9.

Respective diodes D1 and D2 are connected between the emitter and the base of each of transistors T1 and T2 to protect said transistors against their base-emitter junctions being subjected to polarity reversal.

The collectors of transistors TI, T10, T9 and T2 are connected to the collectors of PNP transistors T7, T5, T6, and T8 whose bases are interconnected and whose emitters are connected to a power supply line at a voltage UB+, itself connected to the positive pole of the vehicle battery.

The circuit also has two logic output terminals Si and S2.

The terminal S1 is connected to the collector of a PNP transistor T3 whose base is connected to the collectors of transistors T1 and T7. The emitter of transistor T3 is connected to the UB+ line. The logic output terminal S1 is also connected to ground via a resistor R9. Similarly, the terminal S2 is connected to the collector of a PNP transistor T4 whose base is connected to the collectors of transistors T2 and T8 while its emitter is connected to the UB+ line. The logic output terminal S2 is itself connected to ground via a resistor R12.

It will be observed that the resistors R9 and R12 are not part of the detector proper: they serve as load resistors for the output stages of the detector as constituted by transistors T3 and T4.

The detector circuit shown in FIG. 2 also has a current generator G. The generator G comprises a high resistance resistor R5 connected between the UB+ line and the base of an NPN transistor T11. Said base of transistor T11 is connected to ground via two temperature-compensation diodes D3 and D4 connected in series with a zener diode DZ1. The emitter of transistor T11 is connected to ground via a resistor R3, and also via a subcircuit comprising a series-connection of a resistor R4 and a MOSFET transistor M1, with control thereof being explained in detail below.

The collector and the base of transistor T11 are connected respectively to the collectors of PNP type transistors T13 and T12 connected as a current mirror. The bases of transistors T13 and T12 are connected to the bases of transistors T5 to T8, while their emitters are connected to the UB+ line.

As will have been understood, this embodiment reproduces elements of the detector described in FR - 2 678 070. In particular it reproduces transistors T1, T2, T3, T4 and resistors R10 and R11. Resistors R7 and R8 are replaced herein by transistors T7 and T8 operating as a current source.

Like the detector described in FR - 2 678 070, the detector shown in FIG. 2 does not have a ground potential and the phase inputs φ1 and φ2 can have any value lower than the voltage UB+ without having any effect on the detection threshold level (which is preferably about 200 mV).

The resistor R6 serves to bias the alternator secondary circuit when it is stationary. The resistance of the resistor R6 is large enough to avoid preventing a highly negative voltage being applied to the phase inputs φ1 and φ2 (−10 volts relative to ground).

The detector DP operates as follows: the transistor T11 delivers a current (20 μA) that is calibrated by the resistor R3 and the diodes D3, D4 and DZ1. The diodes D3 and D4 provide temperature compensation for the base-emitter junction of T11 and for the zener voltage of DZ1.

It is assumed that initially transistor Ml is open-circuit.

The current delivered by transistor T11 is copied with a scale factor of 1 (20 μA) by the transistors T12, T7, and T8, and with a scale factor of ½ (10 μA) by the transistors T5 and T6.

The current mirrors constituted by the pairs of transistors T9 & T1 and T10 & T2 copy the currents from T6 and T5 (10 μA). These mirrors maintain voltages that are identical if not close at the points E1 and E2 (emitters of T10 and T1, and emitters of T9 and T2).

When the alternator is stationary, the two branches of the detector are in equilibrium since the voltage on phase φ2 is identical to the voltage on phase φ1. By symmetry, T1 copies the current in T9 (10 μA) and T2 copies the current in T10 (10 μA).

Consequently, the transistors T7 and T8 saturate since they cannot deliver 20 μA, and the transistors T3 and T4 are open-circuit. The outputs S1 and S2 from the detector are thus both taken to ground potential.

However, when the alternator is in rotation, the emf between φ1 and φ2 unbalances the two branches of the detector and the currents in T1 and T2 are no longer fixed at 10 μA. If the voltage of φ1 decreases relative to the voltage of φ2, then the current in R10 and T1 increases and goes from 10 μA to 20 μA. If this current exceeds 20 μA, transistor T7 desaturates and the base of T3 is powered. T3 then conducts and the voltage of S1 is positive relative to ground. Similarly, if the voltage of φ2 decreases relative to the voltage of φ1, the voltage of S2 becomes positive relative to ground as from the threshold where the current in T2 exceeds 20 μA.

FIG. 3 shows how voltage varies on the outputs S1 and S2 when the voltage of φ2 varies sinusoidaly relative to φ1. This corresponds to the emf produced by the remanence of the primary magnetic circuit when the alternator starts rotating.

The threshold level at which a voltage difference between the terminals φ2 and φ2 is detected is preferably about 200 mV. It is shown that this sensitivity level is obtained when the resistors R10 and R11 are chosen to have a resistance of 10 kō.

This 200 mV detection level between the phases enables the alternator to be self-starting at a low speed of rotation (<1000 revolutions per minute (rpm)) without any initial excitation current.

Figure 4:
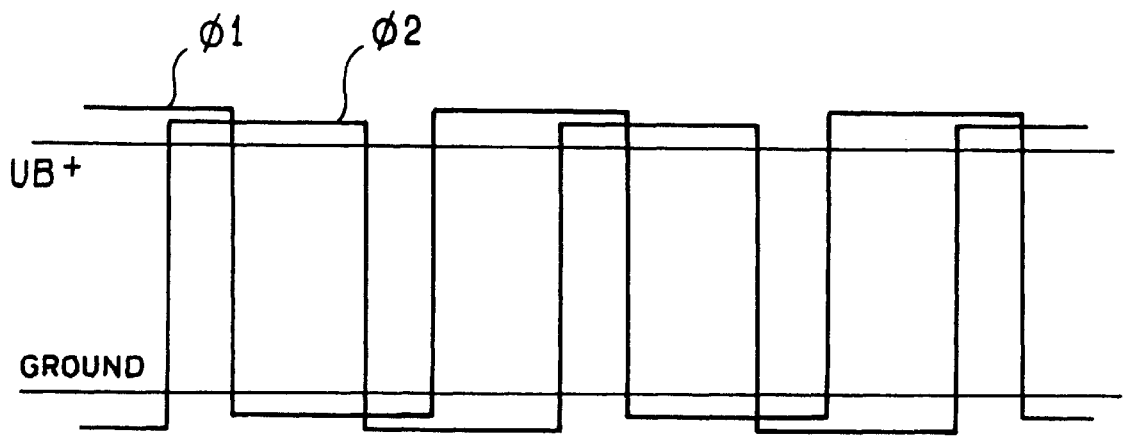
FIG. 4 is a graph showing the phase signals output by the secondary windings of the alternator when the regulator is under load.

Nevertheless, such sensitivity can give rise to poor shaping of the output phase signals S1 and S2 when the alternator is delivering electricity. Under such circumstances, the emf between φ1 and φ2 is no longer a sinewave, but, as shown in FIG. 4, it is rectangular. In particular, when the two negative rectifier diodes connected to φ1 and φ2 are conductive simultaneously, the voltage difference between φ1 and φ2 is theoretically zero. In practice, dispersions in diode characteristics and variations in the currents passed by such diodes mean that variations of 200 mV can occur between φ1 and φ2 within the zone where the voltage difference between φ1 and φ2 is theoretically zero. The resulting signals obtained at S1 and S2 do not correspond to switching fronts of the diodes, so it is no longer possible to measure the period of the phase signals.

The solution consists in increasing the detection level when the emf between φ1 and φ2 is high while remaining below any possibility of charging: for example, the detection threshold level can go from 200 mV to 800 mV when the emf between the phases exceeds 7 volts. This measurement of emf can be performed by the phase signal regulator circuit already in use in many so-called "multifunction" regulators.

The current generator G makes it possible to perform this change in detection threshold level. When the regulator detects an amplitude between phase signals greater than 7 volts, it causes the transistor M1 to conduct, such that the resistor R4 is connected in parallel with R3. Consequently, an increase in current through T11, T5, T6, T7, and T8 gives rise to the looked-for increase in detection threshold level: a detection threshold level of 800 mV is obtained for currents of 100 μA in T11, T7, and T8, and 50 μA in T5 and T6.

Figure 5:
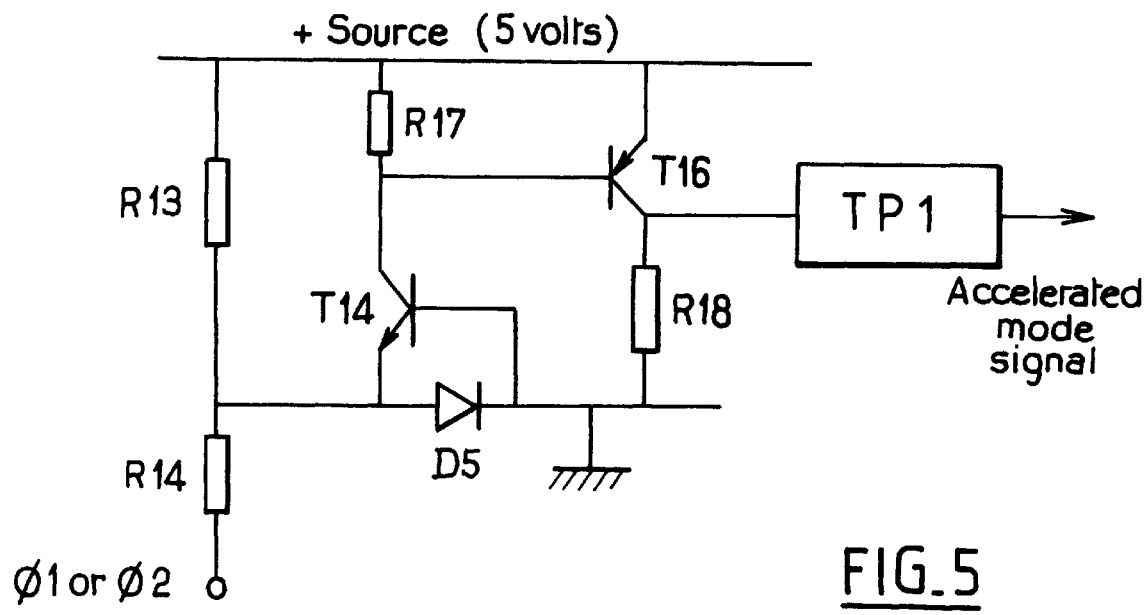
FIGS. 5 and 6 are diagrams of possible circuits for the voltage level detector means which trigger accelerated mode operation for the FIG. 1 regulator

FIG. 5 shows an example of one possible embodiment for the circuit ACC. The circuit shown in this example has time delay means TP1 which are activated by one of the terminals φ1 or φ2 receiving a voltage that is below a given threshold relative to ground.

To this end, potential divider means are interposed between said input terminals and the time delay means TP1. These potential divider means are constituted by two resistors R13 and R14, whose common point is connected to the emitter of an NPN transistor T14 whose base is connected to ground and whose collector is connected via a resistor R17 to a power supply line at +5 volts. The resistor R13 is connected between said line and said emitter. The resistor R14 is connected between said emitter and one of the terminals φ1 and φ2.

A diode D5 is connected between said emitter and ground to protect the base-emitter junction of T14.

A PNP transistor T16 is connected between the power line and ground. More precisely, the base of the transistor T16 is controlled by the collector of transistor T14; its emitter is connected to the power supply line; its collector is connected to ground via a resistor R18. Its collector voltage is also injected to the input of the time delay means TP1.

The potential divider R13–R14 causes the transistor T14 to conduct and thus the transistor T16 to conduct when the voltage of the phase φ1 or φ2 crosses a predetermined level (e.g. −5 volts).

The time delay means TP1 store the signal for switching to accelerated mode, at least until the following half-cycle of φ1 or φ2.

Figure 6:
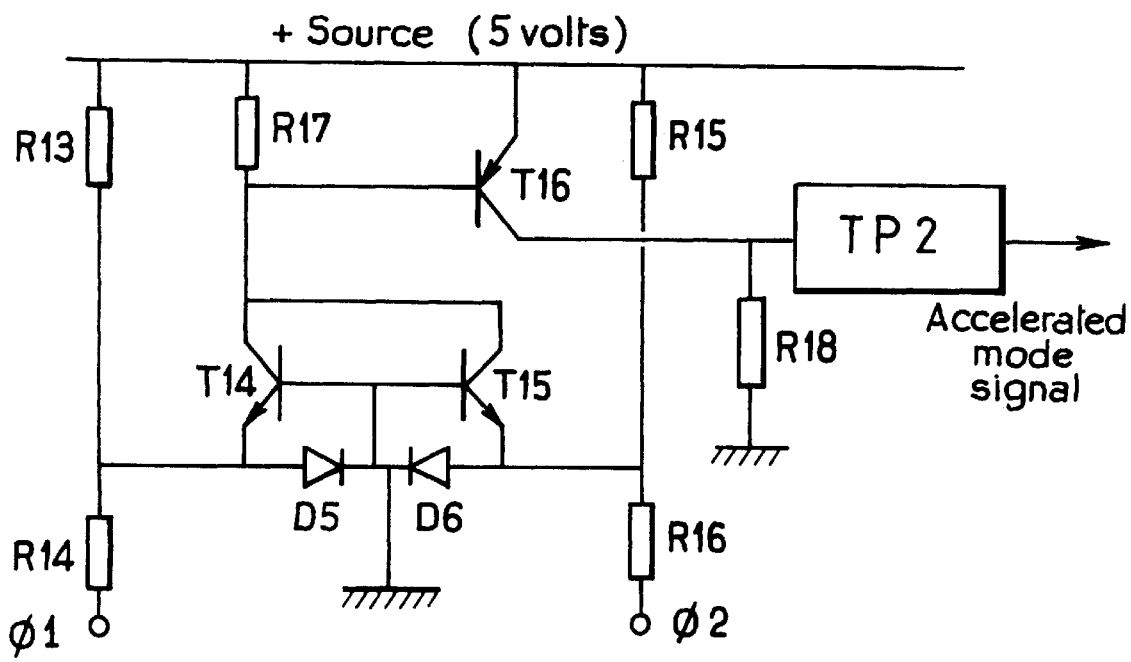

Another possible embodiment is shown in FIG. 6. In this example, a time delay TP2 is controlled by the voltage level on either of the two phase inputs φ1 and φ2. To this end, the potential divider R13–R14 and the transistor T14 controlling the transistor T16 are duplicated by a second potential divider R15–R16 and a second transistor T15. Diodes D5 and D6 protect the base-emitter junctions of the transistors T14 and T15 against reverse bias.

Thus, the time delay which switches on accelerated mode operator is triggered when the voltage on φ1 or the voltage on φ2 passes beneath the above-mentioned threshold (−5 volts, for example). If the signals applied to φ1 and φ2 are in accurate phase opposition (which can easily be achieved during testing), then the time delay TP2 can easily be short.

Naturally, this mode of operation as triggered by highly negative voltages on the terminals φ1 and φ2 cannot occur on a regulator connected to an alternator since the rectifier bridge P prevents the voltage on φ1 or on φ2 going beyond −1 volts.

Operation in accelerated mode can be obtained only during testing of the regulator on its own or mounted on a brush holder.

Naturally, other variant embodiments of the invention can be envisaged.

Figure 7:
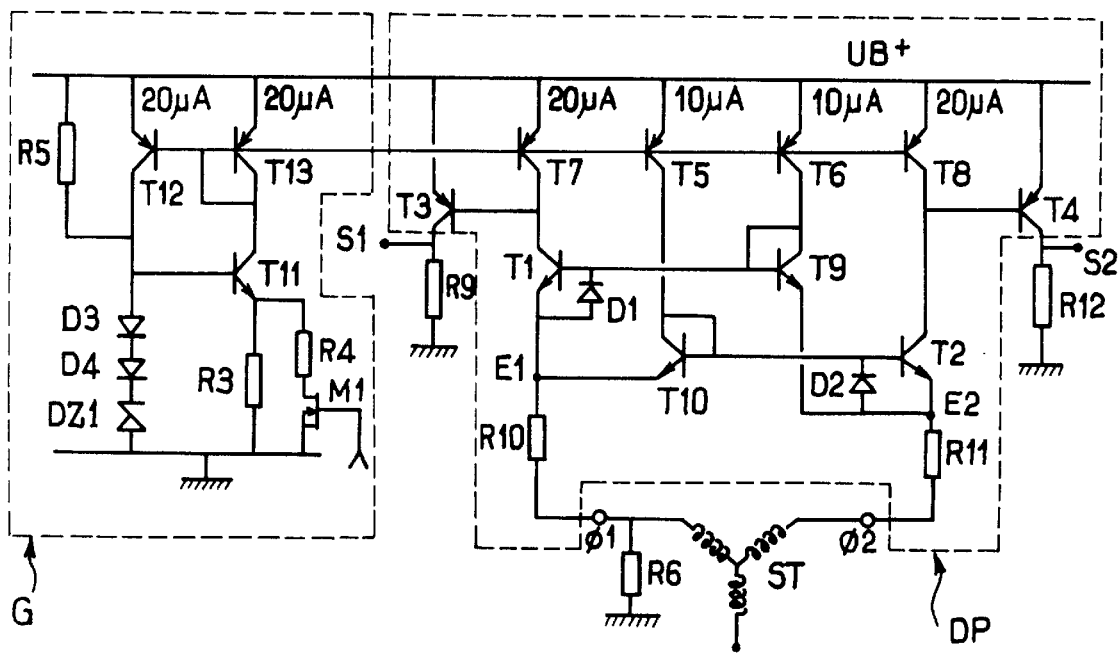
FIG. 7 is a diagram of a conventional three-phase alternator circuit.

In particular, the detector means can be of the type of the circuit represented on FIG. 7 which corresponds to the circuit as represented on FIG. 2 with the differences that the emitters of T9 and T10 are not connected to E1 and E2, but to the phase terminals φ1 and φ2 through resistors R20 and R21 which are of less resistance than R10 and R11, and that the current delivered by transistor T11 is copied with a scale factor of 1 (20 μA) by the transistors T5 to T8. When the alternator is stationary, the currents copied by T1 and T2 are less than the currents in T9 and T10; the current in T1 and T2 is about 12 μA while the current in T9 and T10 is 20 μA; T7 and T8 saturate and T3 and T4 are in open circuit.

A 200 mV detection level is obtained for R10 and Rll being selected to have a resistance of 20 kΩ and for the resistance R21 and R20 being selected to have a resistance of 10 kΩ.

Further, instead of being triggered by a highly negative voltage, accelerated mode can be triggered by the presence of half-cycles on the terminals φ1 and φ2 at a voltage greater than the battery voltage.

I claim:

1. A regulator for a polyphase alternator for a motor vehicle, the regulator including detector means for detecting a voltage difference between the phase terminals that are to receive the phase voltages from said alternator, and means for detecting a trigger signal for triggering operation in an accelerated mode, wherein the means for detecting a trigger signal comprise means for detecting a particular level of the voltage or current on at least one of the phase terminals, and means for triggering accelerated mode operation when said voltage or current level is detected, and wherein the detector means for detecting a voltage difference between the phase terminals are suitable for detecting said voltage difference at the said current or voltage level on said phase terminal.

2. A regulator according to claim 1, wherein the means for detecting the trigger signal comprise means for detecting a particular voltage level in the peaks, at least of the voltage received on a phase terminal.

3. A regulator according to claim 2, wherein said means for detecting the trigger signal include means for detecting that the peaks of the negative half-cycles of said voltage are below a voltage threshold below ground potential.

4. A regulator according to claim 3, wherein said voltage threshold is about 10 volts below ground potential.

5. A regulator according to claim 2, wherein said means for detecting the trigger signal comprise means for detecting that the peaks of the positive half-cycles of a voltage received on a phase terminal are greater than a threshold above battery voltage.

6. A regulator according to claim 1, wherein the means for detecting a voltage difference between the phase terminals comprise a transistor circuit forming a current mirror whose two branches are fed by transistor circuits forming current sources of different currents, one of the transistors of these current source circuits being limited to a predetermined current value when a voltage difference appears between the two phase terminals, said limitation causing a voltage output to change level.

7. A regulator according to claim 6, wherein the level at which a voltage difference is detected between the phases is tied to the current difference between the current sources of the detector means.

8. A regulator according to claim 6, including two logic outputs and wherein said transistor circuits forming a current mirror and current sources are duplicated to cause one or the other of said logic outputs to change level depending on the sign of the voltage difference between the phase terminals.

9. A regulator according to claim 6, wherein the detection threshold level made possible by said means is about 200 mV.

10. A regulator according to claim 9, including means for modifying the detection threshold level for the voltage difference between the phase terminals when the voltage received on said terminals is greater than a given value.

11. A regulator according to claim 1, wherein the means for triggering accelerated mode operation include a time delay circuit connected to the output of means for detecting the voltage or a current level.

* * * * *